US006924080B2

(12) United States Patent

Mulligan et al.

(10) Patent No.: US 6,924,080 B2

(45) Date of Patent: Aug. 2, 2005

(54) THERMALLY SENSITIVE COMPOSITIONS CONTAINING CYANOACRYLATE POLYMERS

(75) Inventors: James Laurence Mulligan, Fort Collins, CO (US); Eric Clark, Loveland, CO (US); David B. Bailey, Webster, NY (US)

(73) Assignee: Kodak Polychrome Graphics LLC, Norwalk, CT (US)

(*) Notice: Subject to any disclaimer, the term of this patent is extended or adjusted under 35 U.S.C. 154(b) by 0 days.

(21) Appl. No.: 10/445,489

(22) Filed: May 27, 2003

(65) Prior Publication Data

US 2004/0241571 A1 Dec. 2, 2004

(51) Int. Cl.[7] ............................ G03F 7/004; G03F 7/30

(52) U.S. Cl. ................. 430/270.1; 430/138; 430/271.1; 430/278.1; 430/281.1; 430/286.1; 430/302; 430/309; 430/348; 430/434; 430/494; 430/495.1; 430/944; 430/945; 101/453; 101/457; 101/465; 101/467

(58) Field of Search .............................. 430/138, 270.1, 430/271.1, 278.1, 281.1, 286.1, 302, 309, 348, 434, 494, 495.1, 944, 945; 101/453, 457, 465, 467

(56) References Cited

U.S. PATENT DOCUMENTS

| | | | | |
|---|---|---|---|---|
| 3,476,937 A | | 11/1969 | Vrancken | |
| 5,605,780 A | * | 2/1997 | Burberry et al. ......... | 430/278.1 |
| 6,482,571 B1 | | 11/2002 | Teng | |
| 6,548,222 B2 | | 4/2003 | Teng | |
| 6,551,757 B1 | * | 4/2003 | Bailey et al. ............ | 430/270.1 |
| 2003/0136284 A1 | * | 7/2003 | Aert et al. ............... | 101/450.1 |

* cited by examiner

*Primary Examiner*—Barbara L. Gilliam

(74) *Attorney, Agent, or Firm*—Faegre & Benson LLP

(57) ABSTRACT

The present invention provides a processless printing plate precursor including a thermally sensitive layer applied onto a substrate. The thermally sensitive layer includes polycyanoacrylate particles having a major dimension between about 50 and about 500 nm, and a mean major dimension of no greater than about 350 nm. The printing plate precursor may be exposed to radiation and may then be developed "on press" with a suitable fountain solution.

40 Claims, 2 Drawing Sheets

1a
1b
1c
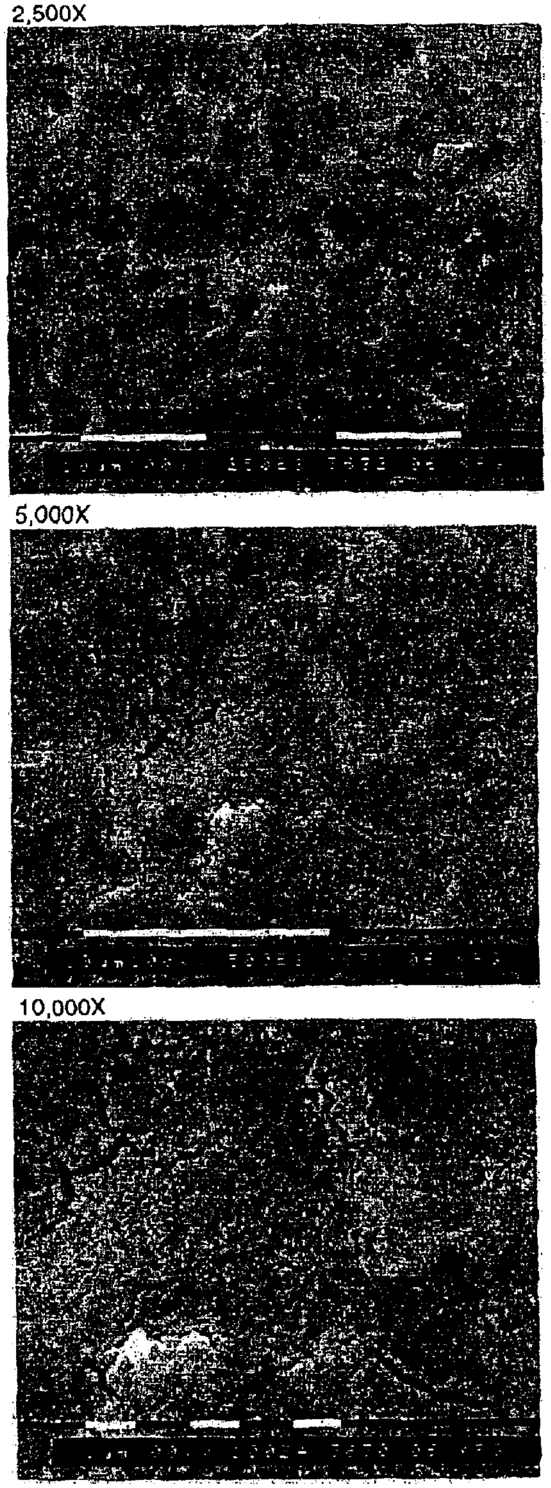
FIG. 1a-c 2a
2,500X
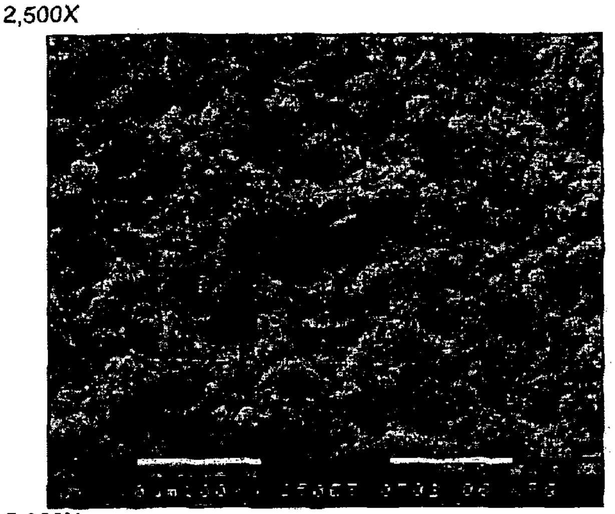
2b
5,000X
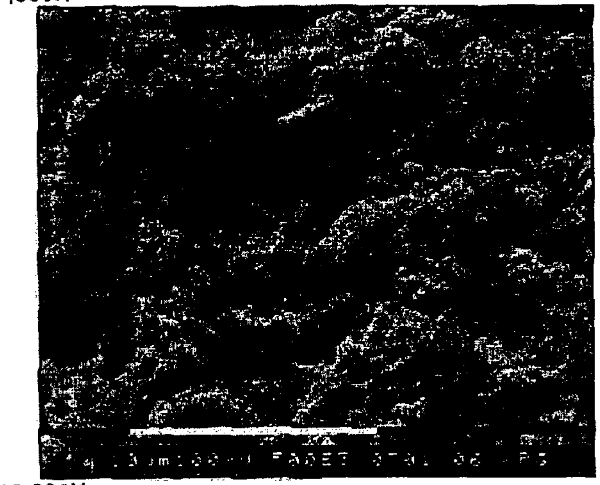
2c
10,000X
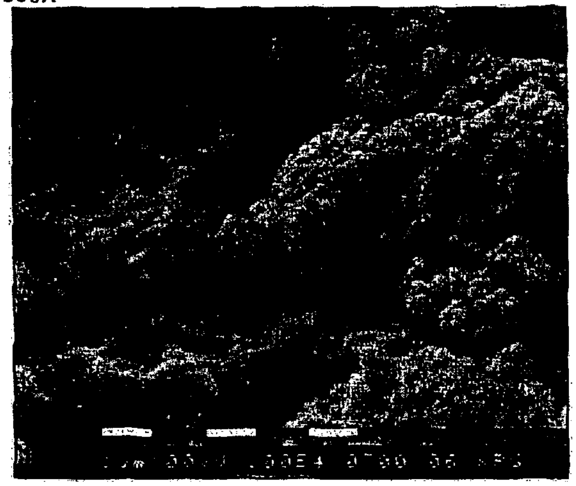
Fig. 2a-c

THERMALLY SENSITIVE COMPOSITIONS CONTAINING CYANOACRYLATE POLYMERS

BACKGROUND

The art of lithographic printing is based on the immiscibility of ink and water. A lithographic printing plate is composed of ink receptive regions, commonly referred to as the "image area," generated on a hydrophilic region on a substrate. When the surface of the printing plate is moistened with water and printing ink is applied, hydrophilic regions retain the water and repel the printing ink, and the image area accepts the printing ink and repels the water. The printing ink retained on the image area may then be transferred to the surface of a material upon which the image is to be reproduced. Typically, the ink is first transferred to an intermediate blanket, which in turn transfers the ink to the desired surface.

Lithographic printing plates typically comprise a radiation-sensitive coating applied over the hydrophilic surface of a substrate. Conventional radiation-sensitive coatings include photosensitive components dispersed within an organic polymeric binder. After a portion of the coating is exposed to radiation (commonly referred to as imagewise exposure), the exposed portion becomes either more developable or less developable in a particular liquid than an unexposed portion of the coating. A printing plate is generally considered a positive-working plate if, after exposure to radiation, the exposed portions or areas of the radiation-sensitive coating become more developable and are removed in the developing process to reveal the hydrophilic surface. Conversely, the plate is considered a negative-working plate if the exposed portions or areas become less developable in the developer and the unexposed portions or areas are removed in the developing process. After being developed in a suitable liquid, the coating areas (i.e. image area) that remain on the plate provide an ink-receptive image, while the revealed regions of the substrate's hydrophilic surface repel ink.

Radiation exposure of imaging layers is generally performed using either ultraviolet, infrared ("IR") or visible radiation. IR radiation exposure (as well as other types of radiation exposure) may be advantageously utilized in an imaging technique referred to herein as "direct-write" imaging. Direct-write imaging using infrared radiation is a process in which a thermally sensitive coating of a printing plate precursor is exposed to infrared radiation from a laser source. More particularly, a computer-controlled infrared laser imagewise exposes small regions of the thermally sensitive composition to produce an image area pixel-by-pixel. Examples of plates prepared by this process are reported in U.S. Pat. No. 5,372,915 (Haley et al.). These plates include an imaging layer comprising a mixture of dissolvable polymers and an infrared radiation absorbing compound. Although the reported plates utilize direct writing techniques, the imaged plates must still be developed in an alkaline solution prior to mounting on a press.

It has further been recognized that such direct writing techniques may be utilized in the formation of "processless" printing plates. As used herein, the term "processless" refers to printing plate precursors that do not require one or more conventional processing steps (e.g. development) prior to mounting on a printing press.

One method for forming processless printing plates is through ablation of a thermally sensitive layer. For example, Canadian 1,050,805 (Eames) reports a dry planographic printing plate comprising an ink receptive substrate, an overlying silicone rubber layer, and an interposed layer containing laser energy absorbing particles (such as carbon particles) in a self-oxidizing binder (such as nitrocellulose). When such plates are exposed to focused, near-IR radiation with a laser, the absorbing layer converts the infrared energy to heat thus partially loosening, vaporizing or ablating the absorber layer and the overlying silicone rubber. Similar plates are reported in *Research Disclosure* 19201 (1980) as having vacuum-evaporated metal layers to absorb laser radiation in order to facilitate the removal of a silicone rubber overcoat layer. These plates are developed by wetting with hexane and rubbing. Additional patents reporting ablatable printing plates include U.S. Pat. No. 5,385,092 (Lewis et al.), U.S. Pat. No. 5,339,737 (Lewis et al.), U.S. Pat. No. 5,353,705 (Lewis et al.), U.S. Re. Pat. No. 35,512 (Nowak et al.), and U.S. Pat. No. 5,378,580 (Leenders).

Ablatable printing plates have a number of disadvantages. The process of ablation tends to produce debris and vaporized materials in the image setting equipment, which must consequently be collected. Also, the laser intensity or power required for ablation may be very high, and the components of such printing plates may be expensive, difficult to use, possess a reduced life, and may produce an unacceptable printing quality.

Thermal or laser mass transfer is another method of preparing processless lithographic printing plates. Such methods are reported, for example, in U.S. Pat. No. 5,460,918 (Ali et al.) wherein a hydrophobic image is transferred from a donor sheet to a microporous hydrophilic crosslinked silicated surface of the receiver sheet. U.S. Pat. No. 3,964,389 (Peterson) reports a process of laser transfer of an image from a donor material to a receiver material requiring a high temperature post-heating step.

EP-A 0 652 483 (Ellis et al.) reports processless lithographic printing plates that are imageable using IR lasers, and that do not require wet processing prior to mounting on a press. These plates comprise an imaging layer that becomes more hydrophilic upon imagewise exposure to heat. This coating contains a polymer having pendant groups (such as t-alkyl carboxylates) that are capable of reacting under heat or acid to form more polar, hydrophilic groups.

U.S. Pat. Nos. 6,482,571 and 6,548,222 to Teng report on-press developable printing plates having a thermosensitive layer including a free radical initiator, a radiation absorbing material and a polymerizable monomer.

More recently, it has been determined that thermally sensitive coatings containing cyanoacrylate polymers may be particularly useful in the formation of processless printing plates. For example, U.S. Pat. No. 5,605,780 (Burberry et al.) reports printing plates that are imaged by an ablation method whereby exposed areas are removed using the heat generated by a focused high-intensity laser beam. The imaging layer is composed of an IR-absorbing compound in a film-forming cyanoacrylate polymer binder. In order for thermal ablation to be successful in such printing plates, the imaging layer thickness is generally less than 0.1 $\mu$m and the weight ratio of IR-absorbing compound to the cyanoacrylate polymer is at least 1:1. Thus, the imaging layers are quite thin and have a significant amount of expensive IR-absorbing compound.

Additionally, U.S. Pat. No. 6,551,757, incorporated herein by reference, reports the use of cyanoacrylate polymers in processless printing plates, in which, after exposure to infrared radiation, imaged regions may be developed "on press" by contacting an imaged thermally sensitive layer containing the cyanoacrylate polymer with aqueous fountain solution.

Although the '780 patent and U.S. patent application Ser. No. 09/864,570 filed May 24, 2001 report the benefits of using cyanoacrylate polymers in thermally sensitive layers of printing plates (e.g. ink affinity, adhesion, wear characteristics), these reported printing plates using cyanoacrylate polymers may tend to suffer from certain drawbacks. First, the reported thermally sensitive layers may provide a discontinuous coating, revealing bare patches of substrate. Second, the reported thermally sensitive layers may produce unsatisfactory levels of ablation during exposure of the plates to IR radiation. Further yet, coatings of this type may suffer from problems with background sensitivity, as well as background scumming.

Thus, it would be desirable to prepare a processless, negative-working lithographic printing plate, which maintains the beneficial characteristics of utilizing cyanoacrylate polymers in thermally sensitive layers, but improves upon or overcomes one or more of the aforementioned drawbacks of using cyanoacrylate polymers.

SUMMARY OF THE INVENTION

In one embodiment, the present invention provides a printing plate precursor including a substrate and a thermally sensitive layer applied onto a surface of the substrate. The thermally sensitive layer includes polycyanoacrylate particles and a photothermal conversion material.

The polycyanoacrylate particles generally have a major dimension between about 50 and about 500 nm, with a mean major dimension of not greater than about 350 nm. Suitable polycyanoacrylates include poly(alkyl cyanoacrylate), poly (aryl cyanoacrylate), and poly(alkoxyalkyl cyanoacrylate), as well as mixtures, copolymers and derivatives thereof. The polycyanoacrylate may also be a polymer or copolymer that includes non-cyanoacrylate groups or monomers.

Suitable photothermal conversion materials may include IR absorbing materials such as IR absorbing dyes and pigments. Such materials may absorb IR radiation and convert the radiation to heat to affect the development of portions or areas of the thermally sensitive layer in a fountain solution. In one embodiment, the photothermal conversion material may be composed of particles having a major dimension of no greater than 25 nm, more particularly between about 10 and about 20 nm.

In another embodiment, the present invention provides a method of making a printing plate precursor in which a coating mixture that includes a combination of a suitable organic or aqueous carrier, polycyanoacrylate particles and a photothermal conversion material is applied onto a substrate surface. The coating mixture is then dried by air or oven drying to form a thermally sensitive layer. As used herein, the term "coating mixture" refers to any homogeneous or heterogeneous combination or mixture of two or more materials. For example, the coating mixture may be a true solution (i.e. a dispersion at the molecular or ionic level), a dispersion, a colloidal dispersion, a slurry, a suspension, or an emulsion.

In one embodiment, the suitable carrier is a substantially aqueous carrier. As used herein, the term "substantially aqueous carrier" refers to carriers composed of at least 50 volume percent water, and optional water-miscible organic liquids.

After application to the substrate, the thermally sensitive layer of the printing plate precursor may then be exposed to imagewise radiation such that exposed portions of the thermally sensitive layer are less developable in fountain solution and/or printing ink than unexposed portions of the layer. The thermally sensitive layer does not require the inclusion of a free-radical initiator.

Advantageously, the imaged printing plate precursor does not need to be developed as an additional processing step. Instead, the precursor may be developed "on press" by fountain solution and/or printing ink used in a part of the printing process. In one embodiment, the fountain solution is an aqueous solution that may contain optional water-miscible organic liquids such as suitable alcohols.

BRIEF DESCRIPTION OF THE DRAWINGS

FIGS. 1*a–c* are SEM micrographs of the thermally sensitive layer of Example 1 at various levels of magnification.

FIGS. 2*a–c* are SEM micrographs of the thermally sensitive layer of Example 2 at various levels of magnification.

DETAILED DESCRIPTION OF THE INVENTION

In one embodiment, the present invention provides a printing plate precursor including a substrate and a thermally sensitive layer applied onto a surface of the substrate. The thermally sensitive layer includes polycyanoacrylate particles and a photothermal conversion material. The polycyanoacrylate particles have an optimized size such that the thermally sensitive layer forms a smooth continuous coating having improved ablation properties and low background sensitivity when applied to the substrate surface.

Suitable substrates for the present invention may vary widely depending upon the desired application and the formulation of the applied thermally sensitive layer. Suitable substrates or substrate surfaces may be hydrophilic, and may be composed of metals, polymers, ceramics, stiff papers, or laminates or composites of these materials. Suitable metal substrates include aluminum, zinc, titanium and alloys thereof. In one embodiment, the substrate includes aluminum, which may be treated by graining and anodizing. Suitable polymeric supports may include polyethylene terephthalate and polyester films. The substrate may be of sufficient thickness to sustain the wear from printing or other desired applications, and be thin enough to wrap around a printing form, having a thickness typically from about 100 to about 600 nm.

Specific examples of suitable substrates and substrate treatments are provided in Table 1 below:

TABLE 1

| SUBSTRATE | SURFACE TREATMENT | INTERLAVER TREATMENT |
|---|---|---|
| AA | Quartz Grained and Anodized | None |
| EG-PVPA | Electrograined and Anodized | Polyvinyl phosphonic acid |
| PF | Electrograined and Anodized | Sodium dihydrogen phosphate/Sodium fluoride |
| G20 | Electrograined and Anodized | Vinylphosphonic acid/acrylamide copolymer |
| EG-Sil | Electrograined and Anodized | Sodium Silicate |
| DS-Sil | Chemically Grained and Anodized | Sodium Silicate |
| PG-Sil | Pumice Grained and Anodized | Sodium Silicate |

TABLE 1-continued

| SUBSTRATE | SURFACE TREATMENT | INTERLAVER TREATMENT |
|---|---|---|
| CHB-Sil | Chemically Grained, Anodized and Silicated | Sodium Silicate |

In Table 1 above, the abbreviation “AA” refers to “as anodized.” An aluminum surface is quartz grained and then anodized using DC current of about 8 A/cm$^2$ for 30 seconds in a 3 Molar $H_2SO_4$ (280 g/liter) solution at 30° C.

“EG” refers to electrolytic graining. The aluminum surface is first degreased, etched and subjected to a desmut step (removal of reaction products of aluminum and the etchant). The plate is then electrolytically grained using an AC current of 30–60 A/cm$^2$ in a 0.3 Molar HCl solution for 30 seconds at 25° C., followed by a post-etching alkaline wash and a desmut step. The grained plate is then anodized using DC current of about 8 A/cm$^2$ for 30 seconds in a 3 Molar $H_2SO_4$ solution (280 g/liter) at 30° C.

“PVPA” refers to polyvinylphosphonic acid. A plate is immersed in a PVPA solution and then washed with deionized water and dried at room temperature.

“PF” refers to a substrate that has a phosphate fluoride interlayer. The process solution contains sodium dihydrogen phosphate and sodium fluoride. An anodized substrate is treated in the solution at 70° C. for a dwell time of 60 seconds, followed by a water rinse and drying. The sodium dihydrogen phosphate and sodium fluoride are deposited as a layer to provide a surface coverage of about 500 mg/m$^2$.

“G20” is a printing plate substrate described in U.S. Pat. No. 5,368,974, which is incorporated herein by reference.

“Sil” refers to an anodized plate is then immersed in a sodium silicate solution to coat it with an interlayer. The coated plate is then rinsed with deionized water and dried at room temperature.

“DS” refers to “double sided smooth.” An aluminum oxide plate is degreased, etched or chemically grained, and subjected to a desmut step. The smooth plate is then anodized.

“PG” refers to “pumice grained.” The surface of an aluminum substrate is degreased, etched and subjected to a desmut step. The plate is then mechanically grained by subjecting it to a 30% pumice slurry at 30° C., followed by a post-etching step and desmut step. The grained plate is then anodized using DC current of about 8 A/cm$^2$ for 30 seconds in a 3 Molar $H_2SO_4$ solution at 30° C. The anodized plate is then coated with an interlayer of, for example, sodium silicate.

“CHB” refers to chemical graining in a basic solution. After an aluminum substrate is subjected to a matte finishing process, a solution of 1 to 3 Molar NaOH is used during graining at 50° C. to 70° C. for 1 minute. The grained plate is then anodized using DC current of about 8 A/cm$^2$ for 30 seconds in a 3 Molar $H_2SO_4$ solution at 30° C. The anodized plate is then coated with a silicate-based interlayer.

The thermally sensitive layer of the present invention may generally include polycyanoacrylate particles and a photothermal conversion material. Suitable polycyanoacrylates include homopolymers derived from a single cyanoacrylate ethylenically unsaturated polymerizable monomer, copolymers derived from two or more such cyanoacrylate monomers, or polymers or copolymers derived from one or more cyanoacrylate monomers and one or more non-cyanoacrylate monomers or materials. Examples of suitable non-cyanoacrylate materials include ethylenically unsaturated polymerizable monomers, photothermal groups, binder groups and suitable polymerizable synthetic monomers. When the polymers include recurring units derived from the non-cyanoacrylate monomers, at least 50 mol % of the recurring units in the polymers may be derived from one or more cyanoacrylate monomers.

Suitable additional monomers or materials that may be copolymerized with one or more cyanoacrylate monomers include, but are not limited to, acrylamides, methacrylamides, acrylates and methacrylates (for example ethyl acrylate, ethyl methacrylate, n-butyl acrylate, methyl methacrylate, t-butyl methacrylate, and n-butyl methacrylate), acrylonitriles and methacrylonitriles, styrene and styrene derivatives, acrylamides and methacrylamides, vinyl ethers, vinyl pyridines, vinyl pyrrolidones, vinyl acetate, vinyl halides (such as vinyl chloride, vinylidene chloride, and vinyl bromide), and dienes (such as ethylene, propylene, 1,3-butadiene, and isobutylene). Acrylates, acrylamides and styrene (and its derivatives) may be particularly useful. Mixtures of the cyanoacrylate polymers may also be used.

In one embodiment, the polycyanoacrylates used in the present invention may include poly(alkyl cyanoacrylates), poly(aryl cyanoacrylates), or poly(alkoxyalkyl cyanoacrylates) wherein an alkyl, aryl or alkoxyalkyl group is present as an ester group. Suitable substituted or unsubstituted alkyl groups may have 1 to 12 carbon atoms and may be linear or branched groups. Suitable substituted or unsubstituted aryl groups include carbocyclic aromatic groups having 6 to 10 carbon atoms in the aromatic ring. Suitable substituted or unsubstituted alkoxyalkyl groups may have 2 to 14 carbon atoms and may be linear or branched groups. Suitable substituents on these groups may include any monovalent chemical moiety that is not harmful to the desired function of the polycyanoacrylate.

Particular polycyanoacrylates suitable for use in the present invention include poly(methyl 2-cyanoacrylate), poly(ethyl 2-cyanoacrylate), poly(methyl 2-cyanoacrylate-co-ethyl 2-cyanoacrylate), poly(methoxyethyl 2-cyanoacrylate), poly(n-butyl 2-cyanoacrylate), poly (phenyl 2-cyanoacrylate), poly(2-ethylhexyl 2-cyanoacrylate), poly(methyl 2-cyanoacrylate-co-methoxyethyl 2-cyanoacrylate-co-ethyl-2-cyanoacrylate), and poly(methyl 2-cyanoacrylate-co-methyl acrylate)(90:10 mol ratio).

The polycyanoacrylate particles of the present invention have many beneficial properties when used in image-forming layers of lithographic printing plates, including relatively low decomposition (typically below 200° C.), good ink affinity, excellent adhesion to the surface of the support (especially anodized aluminum), good resistance to common pressroom chemicals, and high wear resistance. Importantly, additional benefits may be realized by optimizing the particles size of the polycyanoacrylates. Thus, in one embodiment of the present invention, the polycyanoacrylate particles have a major dimension between about 50 and about 500 nm, more particularly between 50 and 400 nm. Further, the polycyanoacrylate particles have a mean major dimension of not greater than 350 nm.

As further exemplified in Comparative Example 2 below, thermally sensitive layers having more than a minimum number of polycyanoacrylate particles sized above 500 nm, may be deficient in several respects. First, the layer tends to be discontinuous, resulting in exposed portions, regions or areas of the substrate prior to imaging. This discontinuity may be detrimental to image quality. Second, during IR imaging of the layer, a significant level of ablation tends to occur. This may result in damage or excessive wear to the IR imaging equipment. Third, a higher number of surface defects are noticeable in the thermally sensitive layer due to the larger particle sizes and/or larger particle agglomerates.

On the other hand, as illustrated in Comparative Example 3, thermally sensitive layers having polycyanoacrylate particles below 50 nm may also have drawbacks. For example, the small particles may result in increased background sensitivity, potentially causing printing ink to adhere to the background of the printing plate. Additionally, small particles may cause undesirable background scumming.

Thus, the polycyanoacrylate particles of the present invention have been optimized within the ranges described herein to improve upon or overcome these undesirable properties. Of course, thermally sensitive layers of the present invention may include some polycyanoacrylate particles outside of these size ranges as long as the beneficial properties exhibited by optimized particles sizes are not substantially adversely affected.

The polycyanoacrylates useful in this invention may be readily prepared by optimizing known polymerization techniques and commonly available starting materials and reagents. For example, polymerization may be initiated by combining suitable cyanoacrylate monomers, available from Loctite Corp., Rocky Hill, Conn., with water, glacial acetic acid and a surfactant such as benzene dodecyl sulfonate to form a latex. Suitable cyanoacrylate monomers include, for example, ethyl-2-cyanoacrylate, methyl-2-cyanoacrylate and mixtures thereof, as well as monomers of other polymers reported herein. In one embodiment, the monomer mixture is Loctite 85, an 80% methyl-2-cyanoacrylate and 20% ethyl-2-cyanoacrylate monomer mixture available from Loctite Corp. In another embodiment, the monomer mixture may be a mixture of 80 parts Loctite 493 (methyl-2-cyanoacrylate) and about 20 parts Loctite 420 (ethyl-2-cyanoacrylate). Particle size may be varied, for example, by altering the amount of surfactant added to the latex, or by varying the amount of heat added to the reaction. Optionally, high shear stirring may assist in providing suitably sized polymeric particles.

The thermally sensitive layer also includes a photothermal conversion material. Suitable photothermal conversion materials may absorb IR radiation and convert it to heat to affect the solubility of the thermally sensitive layer in a developer. Suitable photothermal conversion materials may include, for example, carbon black, Prussian Blue, Paris Blue, Milori Blue, indoaniline dye, cyanine dyes, oxonol dye, porphyrin derivatives, anthraquinone dye, merostyryl dye, pyrylium compounds, or squarylium derivatives with the appropriate absorption spectrum and solubility. Dyes, especially dyes with a high extinction coefficient in the range of 750 nm to 1200 nm, may be suitable. Suitable absorbing dyes are also disclosed in numerous publications, for example, EP 0 823 327 (Nagasaka); U.S. Pat. No. 4,973,572 (DeBoer); U.S. Pat. No. 5,244,771 (Jandrue); and U.S. Pat. No. 5,401,618 (Chapman).

Examples of useful dyes include: 2-[2-[2-phenylsulfonyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]-1-cyclohexen-1-yl]-ethenyl]-1,3,3-trimethyl-3H-indolium chloride; 2-[2-[2-thiophenyl-3-[2-(1,3-dihydro-1,3,3-trimethyl-2H-indol-2-ylidene)-ethylidene]1-cyclopenten-1-yl]-ethenyl]-1,3,3-trimethyl-3H-indolium tosylate; 2-[2-[2-chloro-3-[2-ethyl-(3H-benzthiazole-2-ylidene)-ethylidene]-1-cyclohexen-1-yl]-ethenyl]-3-ethyl-benzthiazolium tosylate; and 2-[2-[2-chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium tosylate. Other examples of useful absorbing dyes include: ADS-830A and ADS-1064 (American Dye Source, Montreal, Canada), EC2117 (FEW, Wolfen, Germany), Cyasorb IR 99 and Cyasorb IR 165 (Glendale Protective Technology), Epolite IV-62B and Epolite III-178 (Epoline), PINA-780 (Allied Signal), SpectraIR 830A and SpectraIR 840A (Spectra Colors), Additional examples of suitable IR dyes may include, but are not limited to, bis(dichlorobenzene-1,2-thiol)nickel(2:1) tetrabutyl ammonium chloride, tetrachlorophthalocyanine aluminum chloride, and the compounds listed in Table 2:

TABLE 2

| IR DYE | STRUCTURE |
|---|---|
| IR DYE 1 | 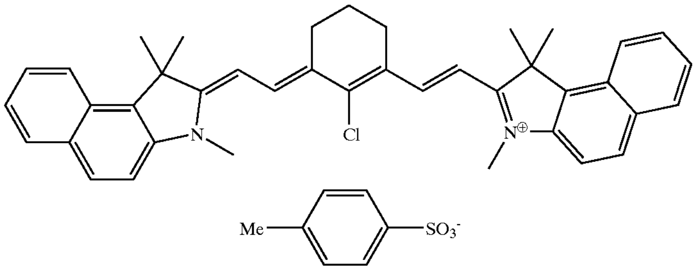 |

TABLE 2-continued
| IR DYE | STRUCTURE |
| --- | --- |
| IR DYE 2 | 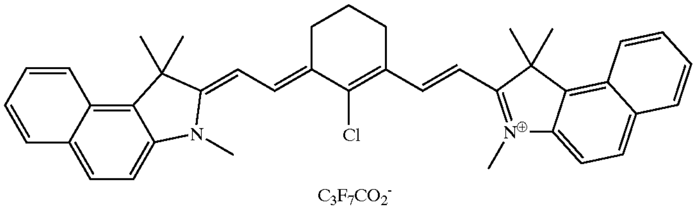 |
| IR DYE 3 | 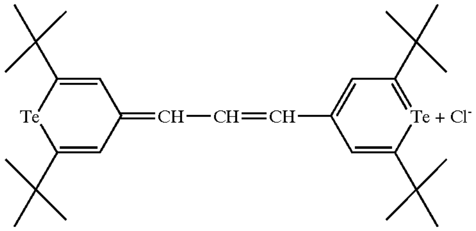 |
| IR DYE 4 | 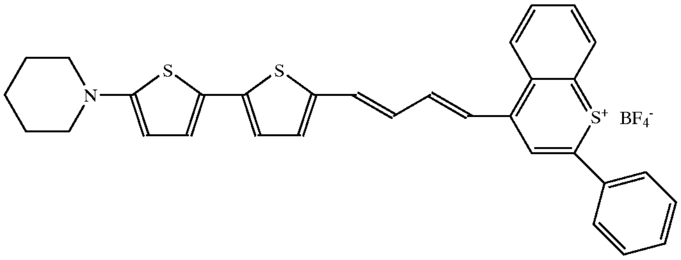 |
| IR DYE 5 | 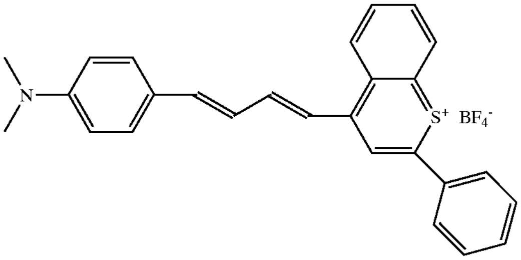 |
| IR DYE 6 | 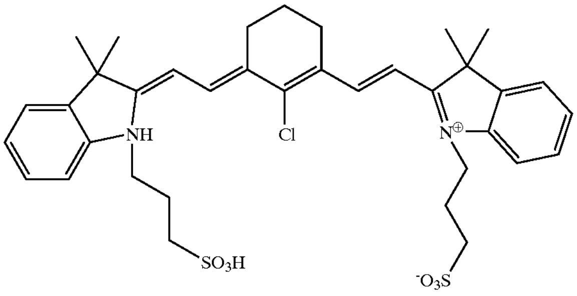 |
| IR DYE 7 | 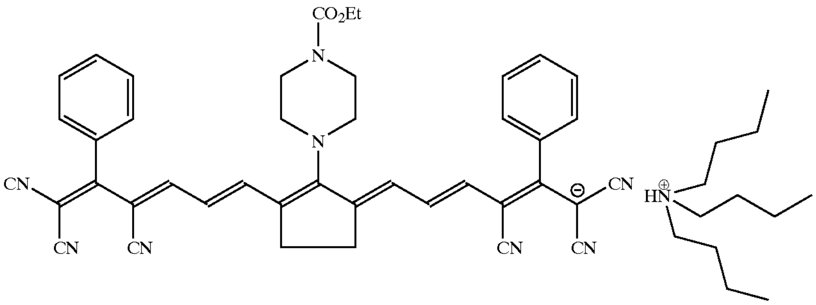 |

TABLE 2-continued
| IR DYE | STRUCTURE |
|---|---|
| IR DYE 8 | 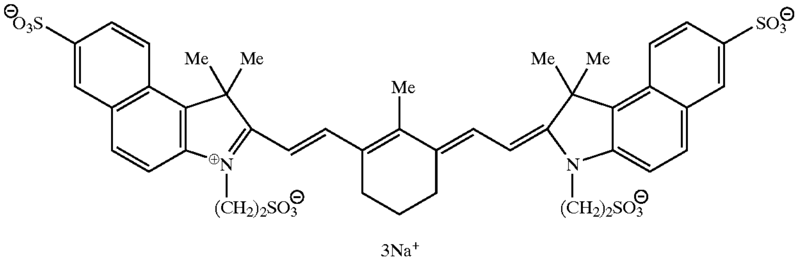 |
| IR DYE 9 | 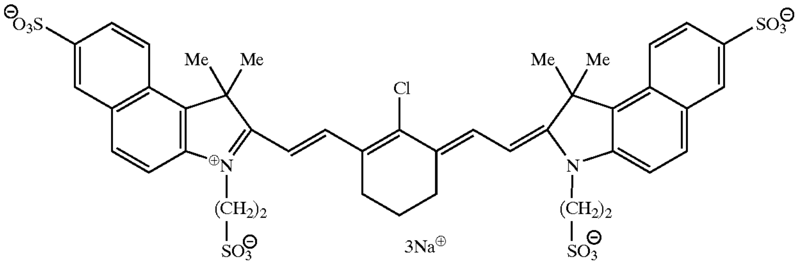 |
| IR DYE 10 | 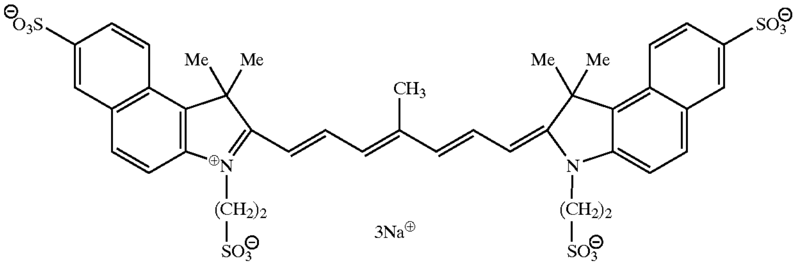 |
| IR DYE 11 | 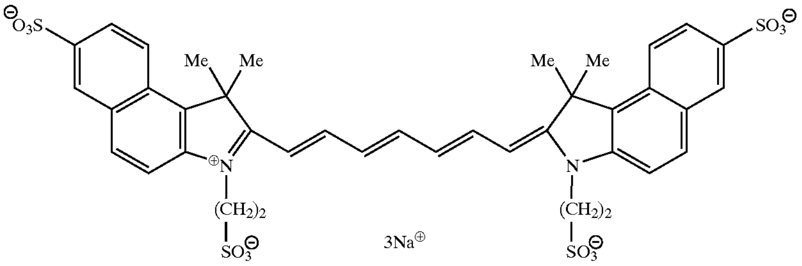 |
| IR DYE 12 | 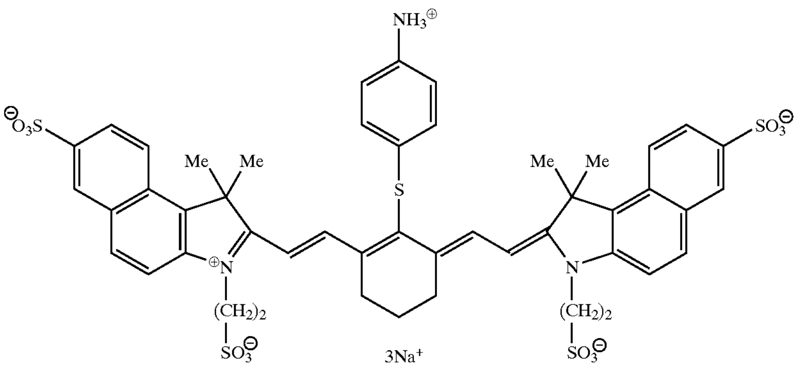 |

TABLE 2-continued

| IR DYE | STRUCTURE |
|---|---|
| IR DYE 13 | 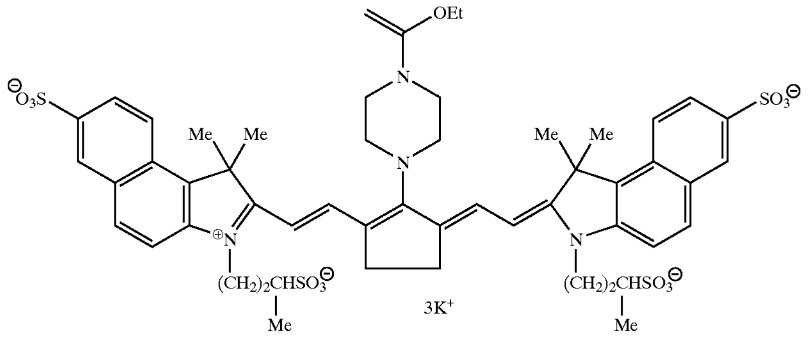 |
| IR DYE 14 | 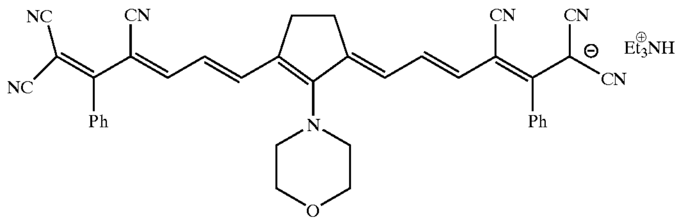 |

IR Dyes 1–7 may be prepared using known procedures or obtained from several commercial sources (for example, Esprit, Sarasota, Fla.). IR dyes 8–14 may also be prepared using known procedures, as reported, for example, in U.S. Pat. No. 4,871,656 (Parton et al.) and references reported therein (for example, U.S. Pat. Nos. 2,895,955, 3,148,187 and 3,423,207). Other useful IR dyes are reported in U.S. Pat. No. 5,605,780 (Burberry, et al). IR dyes 2 and 14 may be particularly useful for use in the present invention because these dyes do not tend to result in particle agglomeration in solution.

Optionally, the photothermal conversion material may also be optimized to provide an improved thermally sensitive layer. In one embodiment, the photothermal conversion materials have a particle mean major dimension of no greater than 25 nm, more particularly 10–20 nm. Particles of this size may provide for improved absorption efficiency Optionally, the thermally sensitive layer of the present invention may include a polymeric binder. Suitable polymeric binders may be soluble or dispersible in substantially aqueous carriers. Examples of suitable polymeric binders include, but are not limited to, polyvinyl alcohols, polyvinyl pyrrolidones, polyethyleneimine (PEI), polyethyloxazoline, polyacrylamide, gelatin, polyacrylic acid, and salts, derivatives and mixtures thereof.

The thermally sensitive layer may also optionally include one or more additives, including dispersing agents, humectants, biocides, surfactants, viscosity builders, colorants, pH adjusters, drying agents, defoamers or combinations thereof.

The thermally sensitive compositions reported herein are generally applied to the substrate as a coating mixture including one or more suitable carriers. Suitable carriers may include both organic and aqueous solvents. More particularly, suitable carriers may include substantially aqueous carriers, including mixtures of water miscible organic liquids in aqueous solutions. A wide range of water miscible organic liquids may be used in the carrier of the present invention. A specific example of a suitable water miscible organic liquid is ethyl acetate.

Suitable amounts of the polycyanoacrylate (or an aqueous dispersion thereof), the photothermal conversion material (s), the optional polymeric binder, and any other optional components may be combined with the carrier to form the coating mixture. A dispersing agent such as polyvinyl pyrrolidone may further be included in the coating mixture to reduce or prevent particle agglomeration. Thus, in one embodiment, polyvinyl pyrrolidone may act as a binder and/or a dispersing agent.

The coating mixture may be applied to the surface of a suitable substrate by conventional methods, such as by spin coating, bar coating, gravure coating, knife coating or roller coating. The coating mixture may then be air dried, oven dried or radiation cured to form a thermally sensitive layer. This drying step may remove and/or evaporate portions of the carrier and/or certain optional components, such as the dispersing agent.

The thermally sensitive layer of the resulting printing plate precursor may be imagewise exposed to thermal radiation, particularly to IR radiation, such that portions of the thermally sensitive layer exposed to the thermal radiation have a lower developability in fountain solution and/or printing ink than unexposed portions. More specifically, the radiation exposed portions adhere more strongly to the substrate such that the exposed portions are less easily developed than unexposed portions. An example of a suitable radiation source is the Creo Trendsetter 3230, which contains a laser diode that emits near infrared radiation at a wavelength of about 830 nm and is available from Creo Products Inc., Burnaby, BC, Canada. Other suitable radiation sources include the Crescent 42T Platesetter, an internal drum platesetter that operates at a wavelength of 1064 nm (Gerber Scientific, South Windsor, Conn., USA), and the Screen PlatRite 4300 series or 8600 series (Screen, Chicago, Ill.). Additional useful radiation sources include direct imaging presses, which are able to image a plate while attached to a printing press cylinder. An example of a suitable direct imaging printing press is the Heidelberg SM74-DI press, available from Heidelberg, Dayton, Ohio.

Advantageously, the resulting imaged printing plate precursor may be mounted in a printing press without first being subjected to a separate developing step. Instead, the imaged printing plate precursor may be developed "on press" by the fountain solution and/or ink used in conventional printing presses. Alternatively, in embodiments that utilize direct imaging presses, the printing plate precursor may be mounted on the direct image press, and may then be exposed to infrared radiation and developed.

Suitable fountain solutions for developing the imaged printing plate precursor include substantially aqueous solvents, which may be alkaline, neutral or acidic. Suitable materials that may be added to the aqueous solution include a variety of alcohols and alcohol replacements. Specific examples of suitable fountain solutions include mixtures of the following components in water:

- Varn Litho Etch 142W+Varn PAR (alcohol sub) @ 3 oz/gal each (Varn International, Addison, Ill.);
- Varn Crystal 2500 (1-step) @ 4.5 oz/gal (Varn International);
- Varn Total Chromefree (@ 3.2 oz/gal) (Varn International)+Anchor ARS-F (@ 1.2 oz/gal) (Anchor, Orange Park, Fla.);
- Anchor Emerald JRZ (3 oz/gal)+Anchor ARS-ML (3.5 oz/gal) (Anchor);
- Rosos Plain KSP (@ 3–4 oz/gal)+Varn PAR @ 3 oz/gal each (Rosos Research Laboratories, Inc.);
- Rosos KSP 500 (@ 5 oz/gal)+RV1000 (@ 4 oz/gal) (Rosos Research Laboratories, Inc.);
- Prisco 3451U (@ 4 oz/gal)+Alkaless 3000 (@ 3 oz/gal) (Prisco, Newark, N.J.);
- Prisco 4451 FK (@ 3 oz/gal)+Alkaless 6000 (@ 2 oz/gal) (Prisco);
- Prisco Webfount 300 (@ 2 oz/gal)+Alkaless 6000 (@ 3 oz/gal) (Prisco);
- Rycoline Green Diamond 251TW (@ 3 oz/gal)+Rycoline Green Diamond alcohol replacer (@ 2 oz/gal) (Rycoline, Chicago, Ill.);
- Allied PressControl EWS (@ 5 oz/gal)+HydroPlus (@ 1.5 oz/gal) (Allied Pressroom Chemistry, Hollywood, Fla.);
- RBP 910H (@ 3 oz/gal)+Aquanol 600 (@ 2 oz/gal) (RBP Chemical Technology, Milwaukee, Wis.);
- Allied Compliance ES (@ 3 oz/gal)+HydroDyne (@ 3 oz/gal) (Allied Pressroom Chemicals);

The areas of the thermally sensitive layer not exposed to thermal radiation are removed after being contacted with fountain solution and/or ink as part of the normal printing process, while exposed areas remain adhered to the support to form an ink receptive image area. Ink applied to the image area may then be imagewise transferred to a suitable receiving material (such as cloth, paper, metal, glass or plastic) to provide one or more desired impressions. If desired, an intermediate blanket roller may be used to transfer the ink from the printing plate to the receiving material. The printing plate may be cleaned between impressions, if desired, using conventional cleaning methods.

The present invention is further described in the following Examples.

EXAMPLE 1

A polycyanoacrylate latex was formed by combining distilled water (1370 g), glacial acetic acid (0.8 g) and sodium benzene dodecyl sulfonate (1.5 g), both available from Aldrich Chemical, Milwaukee, Wis., in a 4 liter flask. After the sodium benzene dodecyl sulfonate dissolved in the water, a mixture of Loctite 85 cyanoacrylate monomer (155 g) and glacial acetic acid (0.8 g) was added dropwise over 5 minutes. Loctite 85 is available from Loctite Corp., Rocky Hill, Conn. and contains 80% methyl-2-cyanoacrylate monomers and 20% ethyl-2-cyanoacrylate monomers. A mildly exothermic polymerization occurred. The solution was heated to between 70 and 75° C. for 10 minutes and then cooled. The solution was then passed through a gauze filter, available from Great Lakes Filter Media, Detroit, Mich.

Particle size analysis using an ultrafine particle analyzer (UPA150) available from Microtrac, Inc., North Largo, Fla., indicated a particle size range between 50 and 500 nm, with major populations at about 90 nm and about 260 nm and a mean particle size of about 90 nm. A coating mixture was then formed by combining the cyanoacrylate particles (76 parts), polyvinyl pyrrolidone binder (18 parts) and IR dye 14 (6 parts) in water. IR dye 14 is represented by the formula:

IR Dye 14

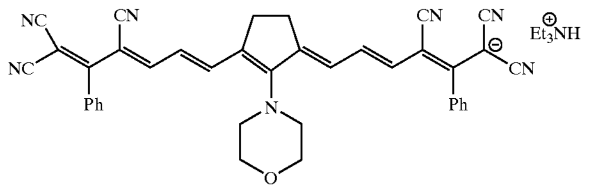

Prior to being added to the coating mixture, IR dye 14 was pre-milled by blending the dye (5 parts) with water (95 parts) and Olin 10G (0.75 parts). Olin 10G is a nonylphenoxypoly (glycidol) surfactant, CIN 10040914, available from Arch Chemicals, Norwalk, Conn. This dye blend was then combined with zirconia stabilized glass beads (1.8 mm in diameter) in a ratio of 313 ml of beads to 125 g of dye blend. The dye blend and the beads were then loaded into a 625 ml glass jar and spun at 83 ft/min for 7 to 10 days (depending on the results of periodic particle size analysis) until substantial portions of the dye particles had a major dimension between 10 and 20 nm.

The coating mixture was then applied to a grained and anodized aluminum substrate and dried to form a thermally sensitive layer. The resulting printing plate precursor was then imagewise exposed in a series of exposures at between about 150 and 300 mJ/cm$^2$ (at intervals of 50) using an internal test pattern on a Creo Trendsetter 3230, a platesetter operating at a wavelength of 830 nm and available from Creo Products Inc., Burnaby, BC, Canada. Samples of the resulting imaged printing plate precursor were then mounted on an AB Dick duplicator press and a Komori press (Model S-26) to determine press performance.

As illustrated in FIGS. 1*a–c*, SEM analysis indicates that printing plates formed according to Example 1 possessed an even coating with no uncoated areas. Additionally, during thermal imaging, the thermally sensitive layer exhibited improved ablation when compared to the thermally sensitive layer reported in Example 2 below. Ablation was measured gravimetrically, as well as by using a PET film to capture ablated material. Gravimetric analysis (using an imaging density of 325 mj/cm$^2$) indicated a loss of thermally sensitive material of 116 mg/m$^2$, which is about 13% of the total coating weight. Additionally, plate performance on press was satisfactory, and the plate exhibited no background sensitivity. Finally, the thermally sensitive layer exhibited satisfactory scratch resistance as indicated by durometer tests.

COMPARATIVE EXAMPLE 2

Methyl cyanoacrylate (70 wt %) and ethyl cyanoacrylate (30 wt %) were copolymerized to form a cyanoacrylate polymer. IR dye 2 was pre-milled by blending the dye (5 parts) with water (95 parts) and Olin 10G (0.75 parts). IR dye 2 is represented by the formula:

IR Dye 2

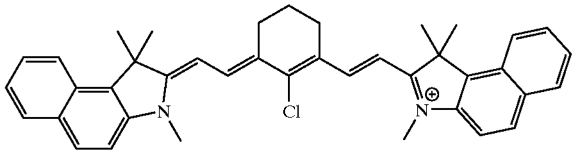

$C_3F_7CO_2^-$

Olin 10G is a nonylphenoxypoly (glycidol) surfactant, CIN 10040914, available from Arch Chemicals, Norwalk, Conn. This dye blend was then combined with zirconia stabilized glass beads (1.8 mm in diameter) in a ratio of 313 ml of beads to 125 g of dye blend. The dye blend and the beads were then loaded into a 625 ml glass jar and spun at 83 ft/min for 7 to 10 days (depending on the results of periodic particle size analysis) until substantial portions of the dye particles had a major dimension between 10 and 20 nm.

The solid polcyanoacrylate (76 parts) and IR dye 2 (6 parts) were then wet milled in a Molinex mill (available from Netzsch, Burlington, Mass.), with water being used as the carrier. The major dimension of the of the polycyanoacrylate particles (as measured with the Microtrac UPA of Example 1) ranged between about 400 and 10,000 nm, with a mean major dimension of about 610 nm. The mill discharge was blended with a polyvinyl pyrrolidone solution (18 parts of solid).

The resulting coating mixture was then applied to a grained and anodized aluminum substrate and was dried to form a thermally sensitive layer. The resulting printing plate precursor was then imagewise exposed in a series of exposures between about 150 and 300 $mJ/cm^2$ (at intervals of 50) using an internal test pattern on the Creo Trendsetter 3230. Samples of the resulting imaged printing plate precursor were then mounted on the AB Dick duplicator press and the Komori press of Example 1 to determine press performance.

As illustrated in FIGS. 2*a–c*, SEM analysis indicated that printing plates formed as in Example 2 possessed a rough texture, including bare portions that revealed the substrate surface. Additionally, during IR exposure, the plate precursor exhibited an increased level of ablation (as compared to example 1). Ablation was assessed gravimetrically and using a PET film to capture ablated material. Gravimetric analysis (using an imaging density of 325 $mj/cm^2$) indicated a loss of thermally sensitive material of about 200 $mg/m^2$, which is about 17% of the total weight of the coating.

COMPARATIVE EXAMPLE 3

A cyanoacrylate polymer was formed as in Example 1, except that the addition time of the cyanoacrylate monomer was shortened as much as practically possible to minimize particle size. The resulting polycyanoacrylate particles had a major dimension ranging between about 20 and about 300 nm with a mean major dimension of 20.6 nanometers, as indicated by using the Microtrac UPA used in Example 1.

Two coating mixtures were formed by combining polycyanoacrylate particles (76 parts), polyvinyl pyrrolidone binder (18 parts) and either IR dye 1 or IR Dye 11 (6 parts for each coating mixture) were then combined with water to form a coating mixture. Each coating mixture was then applied to a grained and anodized aluminum substrate and was dried to form a thermally sensitive layer.

The resulting printing plate precursors were then imagewise exposed in a series of exposures between 150 and 300 $mJ/cm^2$ (in intervals of 50) using an internal test pattern on the Creo Trendsetter 3230. Samples of the resulting imaged printing plate precursors were then mounted on an AB Dick duplicator press and a Komori press to determine press performance.

The thermally sensitive layers formed from both coating mixtures exhibited a uniform coating over the substrate with no bare patches. However, the printing plates exhibited high background sensitivity (i.e. ink present in background) and scumming on press, which resulted in lower quality reproductions.

As demonstrated by Examples 1–3, printing plates formed from thermally sensitive layers that contain polycyanoacrylate particles of optimized size (as reported in Example 1) possessed smooth continuous coatings, with improved ablation properties and low background sensitivity. In contrast, the thermally sensitive layers of Examples 2–3 possessed a discontinuous coating, exhibited significant ablation, and/or exhibited high background sensitivity.

We claim:

1. A printing plate precursor comprising:

a substrate; and a thermally sensitive layer applied onto a surface of the substrate, the thermally sensitive layer comprising:

a photothermal conversion material, and polycyanoacrylate particles consisting of particles having a major dimension in a range between about 50 and about 500 nm and an insubstantial number of particles outside the range between about 50 and about 500 nm; and wherein the particles have a mean major dimension of no greater than 350 nm.

2. The printing plate precursor of claim 1 wherein the substrate is hydrophilic.

3. The printing plate precursor of claim 1 wherein the substrate comprises an aluminum substrate.

4. The printing plate precursor of claim 1 wherein the substrate comprises a polymer substrate.

5. The printing plate precursor of claim 1 wherein the substrate comprises a polyester substrate.

6. The printing plate precursor of claim 1 wherein the polycyanoacrylate particles consist of particles having a major dimension in a range between about 50 and about 400 nm and an insubstantial number of particles outside the range between about 50 and about 400 nm.

7. The printing plate precursor of claim 1 wherein the cyanoacrylate polymer is thermally degradable below about 200° C.

8. The printing plate precursor of claim 1 wherein the dry weight ratio of the photothermal conversion material to the polycyanoacrylate particles is from about 0.02:1 to about 0.8:1.

9. The printing plate precursor of claim 1 wherein the thermally sensitive layer has a dry weight thickness of from about 0.05 to about 20 μm.

10. The printing plate precursor of claim 1 wherein the thermally sensitive layer has a dry weight thickness of from about 0.5 to about 4 μm.

11. The printing plate precursor of claim 1 wherein the thermally sensitive layer has a dry weight of between about 0.5 and about 2.5 $g/m^2$.

12. The printing plate precursor of claim 1 wherein the thermally sensitive layer has a dry weight of between about 1.0 and about 2.0 g/m$^2$.

13. The printing plate precursor of claim 1 wherein the polycyanoacrylate particles comprise poly(alkyl cyanoacrylate), poly(aryl cyanoacrylate), poly(alkoxyalkyl cyanoacrylate) or mixtures or derivatives thereof.

14. The printing plate precursor of claim 1 wherein the polycyanoacrylate particles comprise poly(methyl cyanoacrylate), poly(ethyl cyanoacrylate), poly(methyl cyanoacrylate-co-ethyl cyanoacrylate), poly(methoxyethyl cyanoacrylate), poly(n-butyl cyanoacrylate), poly(phenyl cyanoacrylate), poly(2-ethylhexyl cyanoacrylate), poly (methyl 2-cyanoacrylate-co-methoxyethyl 2-cyanoacrylate-co-ethyl-2-cyanoacrylate), poly(methyl 2-cyanoacrylate-co-methyl acrylate), or mixtures or derivatives thereof.

15. The printing plate precursor of claim 1 wherein the polycyanoacrylate particles comprise a copolymer including units derived from at least one cyanoacrylate polymerizable monomer and units derived from at least one non-cyanoacrylate monomer, wherein the units derived from the at least one cyanoacrylate polymerizable monomer comprise at least 50 mol % of the total units in the copolymer.

16. The printing plate precursor of claim 1 wherein the thermally sensitive layer further comprises a polymeric binder.

17. The printing plate precursor of claim 16 wherein the polymeric binder comprises polyvinyl alcohol, polyvinyl pyrrolidone, polyethyleneimine, polyethyloxazoline, polyacrylamide, gelatin, polyacrylic acid, or mixtures thereof or derivatives thereof.

18. The printing plate precursor of claim 1 wherein the photothermal conversion material comprises a dye or a pigment.

19. The printing plate precursor of claim 1 wherein the photothermal conversion material comprises carbon black, Prussian Blue, Paris Blue, Milori Blue or a cyanine dye.

20. The printing plate precursor of claim 1 wherein the photothermal conversion material comprises bis (dichlorobenzene-1,2-thiol)nickel(2:1)tetrabutyl ammonium chloride, tetrachlorophthalocyanine aluminum chloride, or a compound represented by the formulas:

IR Dye 1

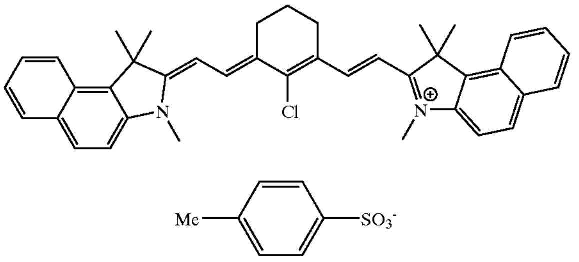

IR Dye 2

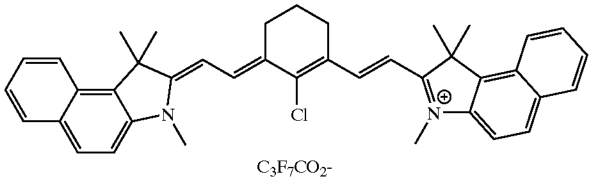

IR Dye 3

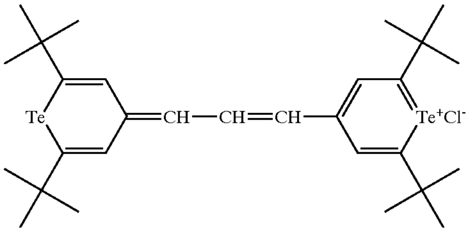

IR Dye 4

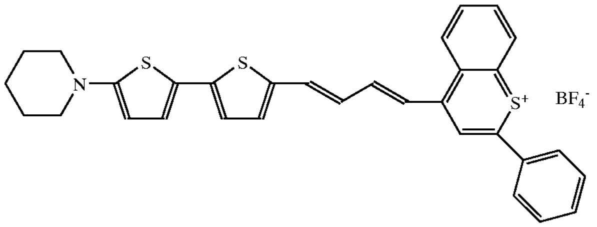

IR Dye 5

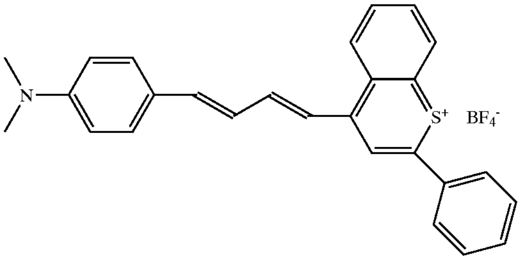

IR Dye 6

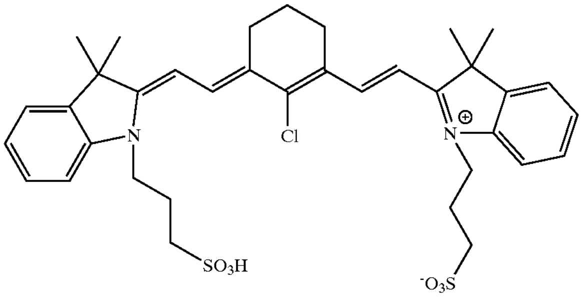

-continued
IR Dye 7
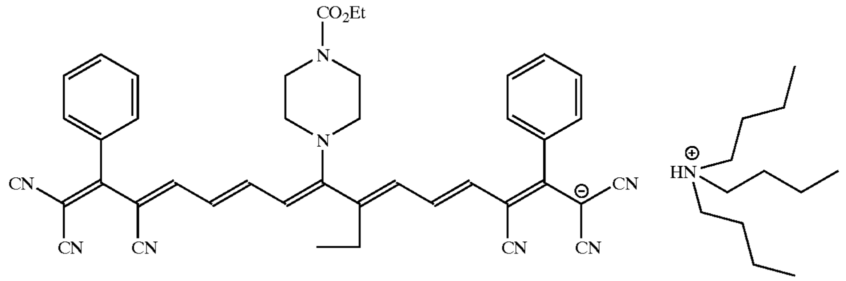
IR Dye 8
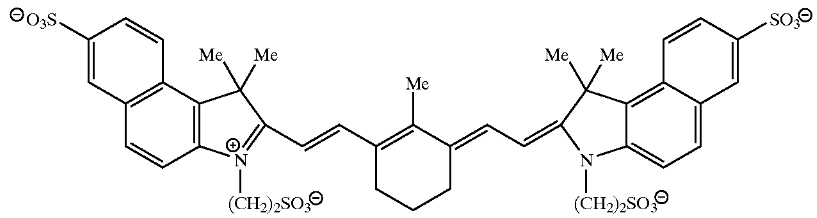
IR Dye 9
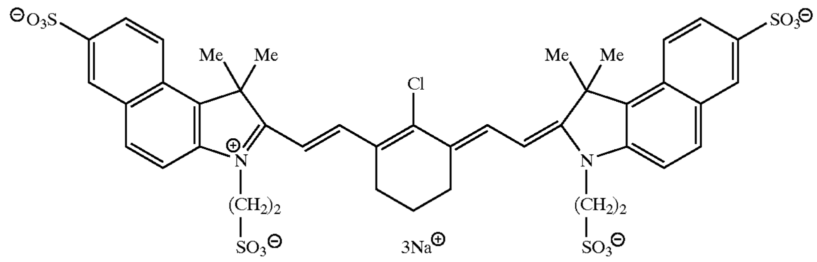
IR Dye 10
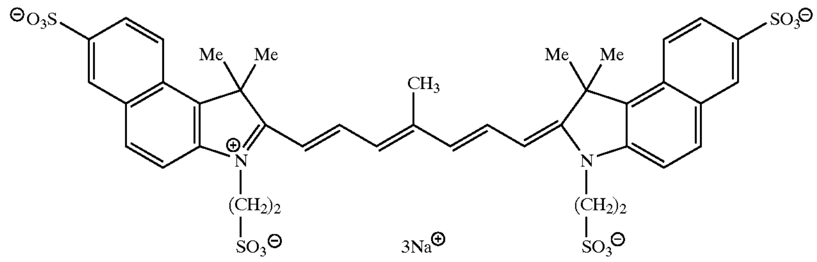
IR Dye 11
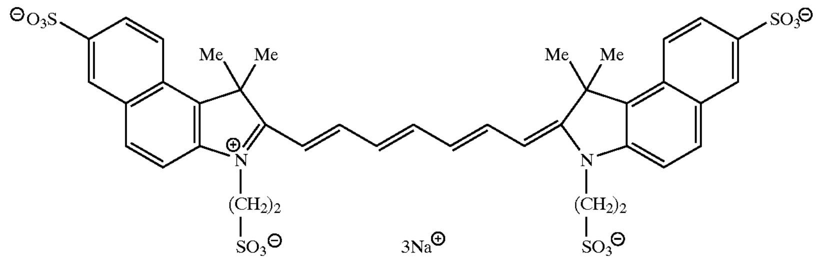

-continued

IR Dye 12

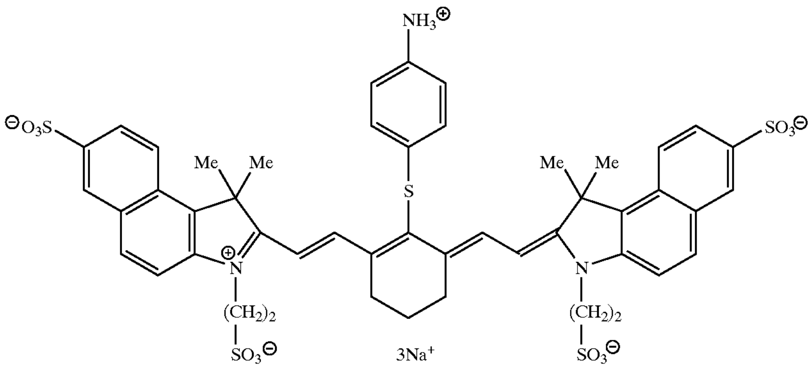

IR Dye 13

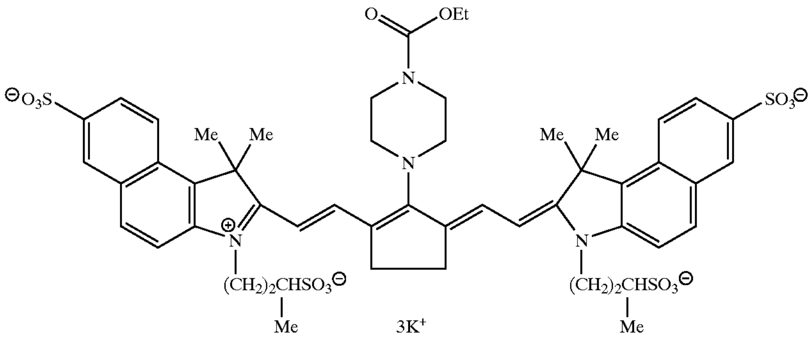

or

IR Dye 14

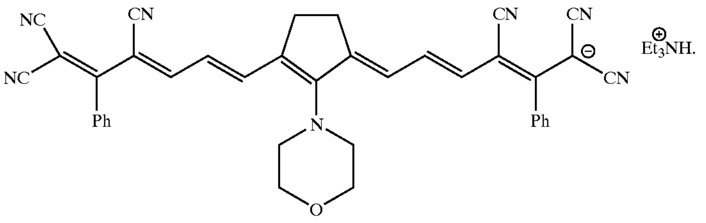

21. The printing plate precursor of claim 1 wherein the photothermal conversion material is soluble in an aqueous solution.

22. The printing plate precursor of claim 21 wherein the thermally sensitive layer further comprises a dispersant.

23. The printing plate precursor of claim 22 wherein the dispersant comprises polyvinyl pyrrolidone.

24. An imaged printing plate precursor comprising:

a substrate;

a thermally sensitive layer including:

a radiation exposed image area comprising a polycyanoacrylate material; and a non-radiation exposed area comprising polycyanoacrylate particles and a photothermal conversion material, wherein the polycyanoacrylate particles consist of particles having a major dimension in a range between about 50 and about 500 nm and an insubstantial number of particles outside the range between about 50 and about 500 nm, and wherein the particles have a mean major dimension of no greater than 350 nm.

25. The printing plate precursor of claim 24 wherein the thermally sensitive layer further comprises a polymeric binder.

26. A method of making a printing plate precursor comprising:

providing a substrate;

applying onto the substrate a coating mixture comprising a mixture of a carrier, polycyanoacrylate particles and a photothermal conversion material, wherein the polycyanoacrylate particles consist of particles having a major dimension in a range between about 50 and about 500 nm and an insubstantial number of particles outside the range between about 50 and about 500 nm, and wherein the particles have a mean major dimension of no greater than 350 nm; and drying the coating mixture to form a thermally sensitive layer on a surface of the substrate.

27. The method of claim 26 wherein the carrier comprises an aqueous carrier, a water-miscible organic carrier or a combination thereof.

28. The method of claim 26 wherein the carrier comprises a substantially aqueous carrier.

29. The method of claim 26 wherein the carrier comprises ethyl acetate.

30. The method of claim 26 wherein the polcyanoacrylate particles are dispersed within the carrier.

31. The method of claim 26 wherein the photothermal conversion material is dispersed within the carrier.

32. The method of claim 26 wherein the coating mixture further comprises a dispersing agent.

33. The method of claim 32 wherein the dispersing agent comprises polyvinyl pyrrolidone.

34. The method of claim 26 further comprising:

imagewise exposing portions of the thermally sensitive layer to infrared radiation to form an imaged printing plate precursor, wherein exposed portions of the layer are less developable in a fountain solution, printing ink or both, than unexposed portions of the thermally sensitive layer.

35. The method of claim 34 wherein the thermally sensitive layer is imagewise exposed to radiation after being placed on a direct imaging press.

36. The method of claim 35 wherein after imagewise exposure, the thermally sensitive layer is exposed to fountain solution, printing ink or both, to remove unexposed portions of the thermally sensitive layer.

37. The method of claim 34 further comprising: mounting the imaged printing plate precursor on a printing press; and exposing the thermally sensitive layer to fountain solution, printing ink or both, to remove unexposed portions of the thermally sensitive layer.

38. A printing plate precursor comprising:

a substrate; and a thermally sensitive layer applied onto a surface of the substrate, the thermally sensitive layer comprising:

polycyanoacrylate particles having a major dimension between about 50 and about 500 nm and a mean major dimension of no greater than 350 nm, and a photothermal conversion material comprising an IR dye represented by the formula:

IR Dye 2

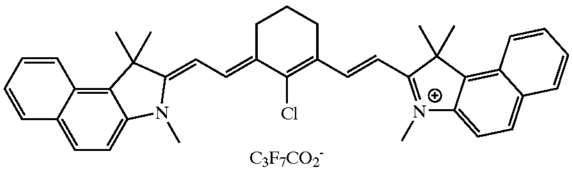

$C_3F_7CO_2^-$ or

IR Dye 14

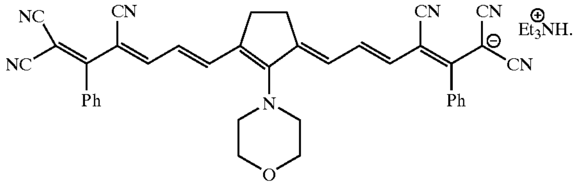

39. A printing plate precursor comprising:

a substrate; and a thermally sensitive layer applied onto a surface of the substrate, the thermally sensitive layer comprising:

polycyanoacrylate particles having a major dimension between about 50 and about 500 nm and a mean major dimension of no greater than 350 nm, and a photothermal conversion material comprising particles having a major dimension no greater than 25 nm.

40. The printing plate precursor of claim 39 wherein the photothermal conversion material comprises particles having a major dimension between about 10 and about 20 nm.

* * * * *

UNITED STATES PATENT AND TRADEMARK OFFICE

CERTIFICATE OF CORRECTION

PATENT NO. : 6,924,080 B2 Page 1 of 1
DATED : August 5, 2005
INVENTOR(S) : James Laurence Mulligan et al.

It is certified that error appears in the above-identified patent and that said Letters Patent is hereby corrected as shown below:

Columns 21-22,
Structure IR Dye 8, should be:

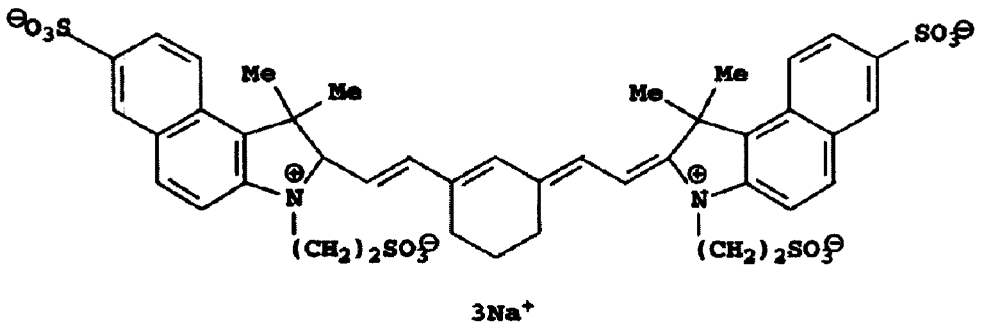

Signed and Sealed this

First Day of November, 2005

JON W. DUDAS
*Director of the United States Patent and Trademark Office*